United States Patent [19]
Tokiguchi et al.

[11] Patent Number: 6,104,025
[45] Date of Patent: *Aug. 15, 2000

[54] ION IMPLANTING APPARATUS CAPABLE OF PREVENTING DISCHARGE FLAW PRODUCTION ON REVERSE SIDE SURFACE OF WAFER

[75] Inventors: Katsumi Tokiguchi, Mito; Takayoshi Seki, Hitachi; Kensuke Amemiya, Hitachinaka; Yasuo Yamashita, Mito; Kazuo Mera, Hitachi; Isao Hashimoto, Hitachi; Keiji Arimatsu, Hitachi, all of Japan

[73] Assignee: Hitachi, Ltd., Tokyo, Japan

[ * ] Notice: This patent is subject to a terminal disclaimer.

[21] Appl. No.: 09/314,303

[22] Filed: May 19, 1999

Related U.S. Application Data

[63] Continuation of application No. 08/826,421, Mar. 27, 1997, Pat. No. 5,945,681.

[30] Foreign Application Priority Data

Mar. 29, 1996 [JP] Japan ...................................... 8-75826
Jul. 4, 1996 [JP] Japan ................................... 8-174572

[51] Int. Cl.[7] .................................................. H01J 37/30
[52] U.S. Cl. .................. 250/251; 250/443.1; 250/492.21
[58] Field of Search ..................................... 250/251, 398, 250/443.1, 492.21

[56] References Cited

U.S. PATENT DOCUMENTS

| | | | |
|---|---|---|---|
| 3,507,709 | 4/1970 | Bower | 250/492.2 |
| 3,798,495 | 3/1974 | Hergenrother et al. | |
| 4,361,762 | 11/1982 | Douglas . | |
| 5,089,710 | 2/1992 | Kikuchi et al. . | |
| 5,286,978 | 2/1994 | Yoshida et al. | 250/492.21 |
| 5,293,508 | 3/1994 | Shiratake . | |
| 5,435,379 | 7/1995 | Moslehi et al. | 250/443.1 |
| 5,466,929 | 11/1995 | Sakai et al. . | |
| 5,576,538 | 11/1996 | Sakai et al. . | |
| 5,668,368 | 9/1997 | Sakai et al. . | |
| 5,753,923 | 5/1998 | Mera et al. | 250/443.1 |

*Primary Examiner*—Bruce C. Anderson
*Attorney, Agent, or Firm*—Beall Law Offices

[57] ABSTRACT

An ion implanting apparatus is capable of preventing occurrence of discharge flaws on a reverse side surface of a silicon wafer when the silicon wafer is ion-implanted at a temperature exceeding 300° C. The ion implanting apparatus has an ion current of 10 mA to 100 mA, and an electron beam generating apparatus for irradiating an electron beam onto the reverse side surface of the silicon wafer. The electron beam is controlled so that current flowing between the wafer and the rotating disk supporting the wafer becomes substantially zero.

8 Claims, 7 Drawing Sheets

SIGNAL FOR
COMPLETION OF
IMPLANTING

ION IMPLANTING APPARATUS CAPABLE OF PREVENTING DISCHARGE FLAW PRODUCTION ON REVERSE SIDE SURFACE OF WAFER

This is a continuation application of U.S. Ser. No. 08/826,421, filed Mar. 27, 1997 U.S. Pat. No. 5,905,681.

BACKGROUND OF THE INVENTION

The present invention relates to an ion implanting apparatus for fabricating a highly-integrated device by ion-implanting boron, phosphorous, arsenic or the like into a silicon semiconductor, or fabricating a silicon substrate having an embedded insulator layer by ion-implanting and oxygen, nitrogen, and more particularly relates to an ion implanting apparatus suitable for large current ion-implanting in which ions are implanted into a silicon wafer having a small ratio of surface area covered with an insulator while the silicon wafer is being maintained at a high temperature.

FIG. 2A and FIG. 2B show a conventional ion implanting apparatus. FIG. 2A is the front view and FIG. 2B shows the construction of the ion implanting chamber seeing from the side of a beam 4. In the figure, the other main constituting parts such as an ion source, a mass separator, a lens, a slit, a deflector and so on are not shown. There are a lot of conventional ion planting apparatuses of such types, and one of them is disclosed, for example, in U.S. Pat. No. 5,089,710.

As shown in the figure, a surface of a silicon wafer 2 to be implanted with ions is generally patterned with an insulator film such as an $SiO_2$ film or a resist, and accordingly the area of exposed silicon base is small.

A plurality of wafers 2 are mounted on a surface of a rotating disk 1 having a diameter of, generally, one meter or so. In order to perform uniform implanting, the rotating disk 1 is mechanically moved to and fro in the radial direction shown by a line having both side arrows in FIG. 2B.

Since an insulator film covers a large portion of the surface of a silicon wafer 2 in the prior art, the insulator film is charged by irradiation of an ion beam 4. The ion beam 4 is expanded by the charged insulator film and consequently uniform implanting cannot be performed due to performed by change in the current density of the ion beam during ion implanting. Further, an electric breakdown is produced in the insulator film to break the element itself formed on the silicon wafer 2.

In order to solve such a problem, in the past, electrons are supplied together with the ion beam 4. As the electron supply methods in the prior art, there is a method in which an electron beam generating unit is arranged in the middle of the ion beam 4 near the wafer, as shown in FIG. 2A. The ion beam generating unit is generally composed of a heated filament 6 and an electrode extracting electrons from the filament 6 to generate a primary electron beam 7. The electron beam 7 is irradiated on a secondary electron emitting plate 5 to generate a lot of secondary electrons from the secondary electron emitting plate 5 and the secondary electrons are supplied to the silicon wafer 2. The reason why the electron beam 7 is not directly irradiated onto the silicon wafer 2 is that a large quantity of impurity elements are generally released from the heated filament 6 when the heated filament 6 is heated and contamination of the wafer by even a very small quantity of impurity elements is not allowed in fabrication of a highly integrated device.

Referring to FIG. 2A, it is well known that an electron beam 7 having an energy higher than 100 eV is usually not efficiently taken in the ion beam 4. In order to take in the electron beam efficiently, it is necessary that the energy of the electrons is reduced to a value smaller than several tens eV.

Because of the above reason, in the prior art, a large quantity of secondary electrons are generated and irradiated onto the silicon wafer 2 though an electron generating unit that has a complex construction and requires an electric power source and so on.

The prior art is characterized by the ion beam 4 being implanted inside the silicon wafer 2 through an insulator film covering the silicon wafer 2 and it is required to pour electrons onto a surface of the silicon wafer being irradiated with the ion beam in order to prevent the wafer from being charged.

However, in the industrial field of semiconductor ion implanting in recent years, a method of using ion implanting is growing wider. In the method, a silicon substrate which has no insulator film on its surface but has an insulator film formed within is fabricated by implanting an element forming an insulator by chemically reacting with silicon.

The ions used are oxygen ions, nitrogen ions and so on. The ion implanting is performed while the semiconductor wafer is being kept at a high temperature from several hundreds °C. to near 1000° C. In this ion implantation, since there is no insulator film on the surface of the semiconductor wafer, the heated filament 6 and the electron generating unit including the secondary electron emitting plate 5 shown in FIG. 2 are not required.

SUMMARY OF THE INVENTION

However, in such a conventional ion implanting apparatus, it is found that discharge flaws are formed on the reverse side surface of the silicon wafer in the contact surface between the silicon wafer 2 and the rotating disk 1 as it becomes possible to perform implantation with an ion beam current exceeding several tens milli-amperes as in recent years. Further, it is also observed that scattered objects generated by discharge are attached onto the surface of the silicon wafer.

The inventors of the present invention have concluded that the discharge flaws are formed by the following cause.

Since the whole surface of a silicon wafer without patterning is possibly used for a device, it is impossible to employ a method of fixing the silicon wafer by holding a part of the peripheral portion of the silicon wafer with other parts when the silicon wafer to be implanted is mounted onto a disk. The reason is that the fixing part makes a shadow where ions are not implanted. Therefore, the conventional ion implanting apparatus shown in FIG. 2A employs a method of fixing the silicon wafer onto the disk by attracting it from the reverse side using an electrostatic chuck, or a method of mechanically contacting and fixing the silicon wafer onto the disk by setting the silicon wafer on a tilt and using a centrifugal force caused by rotation.

In general, in a silicon wafer with patterning, there is a non-patterned portion within 1 mm inside from the periphery of the silicon wafer. Therefore, there are some cases where the silicon wafer is mechanically fixed onto a disk using the non-patterned portion. Particularly, all of the parts in the implanting chamber including the silicon wafer are cooled so that the temperature of the silicon wafer becomes 50° C. or lower. The implanting current is smaller than 20 mA.

However, in the recent large current ion implanting under a high temperature condition, a common electrostatic chuck cannot be used since the attracting force of the electrostatic chuck is decreased at a temperature exceeding 300° C. Of course, there is a possibility that an electrostatic chuck usable at a high temperature up to nearly 600° C. can be improved by developing an electrostatic chuck material in the future. However, it is impossible in the present state of technology. Therefore, in the large current ion implanting apparatus, the centrifugal force fixing method has been employed.

In a case of the silicon wafer without patterning being mechanically held and fixed at the periphery of the silicon wafer, when the silicon wafer is fixed to a disk by tilting and using a centrifugal force of the rotating disk, electrical contact between the silicon wafer and the disk cannot be sufficient. Therefore, the whole implanted silicon wafer is likely to be charged to cause small discharge between the silicon wafer and the disk. This discharge produces discharge flaws on the reverse side surface of the silicon wafer and scatters foreign objects. In particular, the silicon wafer periodically suffers thermal deformation and is apt to produce a gap between the silicon wafer and the disk since the silicon wafer is heated up by the heating unit and periodically heated by the irradiation of a large current beam. It is thought that this phenomenon further induces discharge.

When such discharge occurs, contamination of foreign objects occurs to produce various troubles in subsequent device fabrication. The foreign objects produced by discharge become a source of permanent contamination since the foreign objects are scattered all over the implanting chamber. Therefore, in the implantation under a high temperature, it is required to prevent occurrence of the discharge flaws on the reverse side surface of a wafer accompanied by ion irradiation.

An object of the present invention is to provide an ion implanting apparatus by which ion implanting can be performed without discharge flaws on the reverse side surface of a wafer, and particularly large current ion implanting can be performed without discharge flaws.

The above object can be attained by preventing the charging or by effectively reducing ion beam current flowing between the silicon wafer and the wafer holding disk through irradiating of an electron beam onto the silicon wafer. Since the discharge flaws are produced on the reverse side surface, it is effective to irradiate the electron beam or a plasma directly onto the reverse side surface of the silicon wafer.

BRIEF DESCRIPTION OF THE DRAWINGS

FIG. 2A is a partially cross-sectional view and FIG. 2B is a plan view of a rotating disk mounting a silicon wafer.

DETAILED DESCRIPTION OF THE PREFERRED EMBODIMENTS

Figure 1:
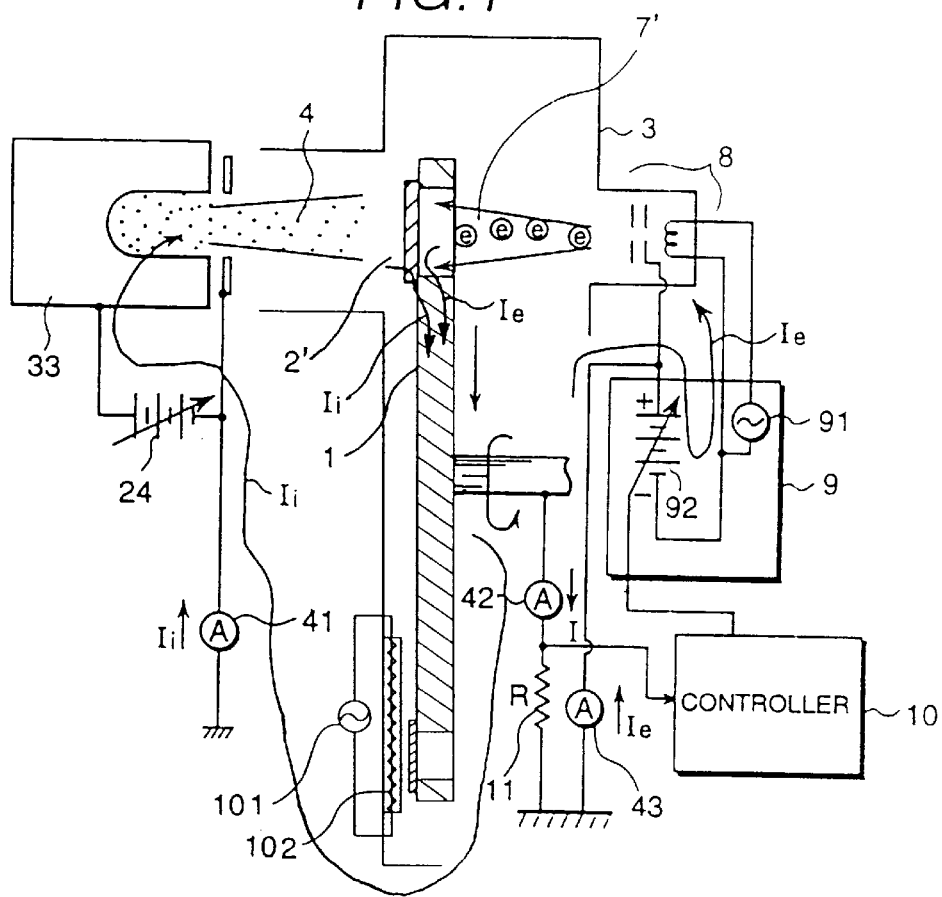
FIG. 1 is a view showing an embodiment of an ion implanting apparatus in accordance with the present invention.

FIG. 1 shows an embodiment of an ion implanting apparatus in accordance with the present invention in which a rotating disk 1 is shown by its cross-section. In this embodiment, the disk 1 has an opening which corresponds to the reverse side surface portion of a silicon wafer 2', and an electron beam 7' generated by an electron beam generating unit 8 is efficiently irradiated onto the reverse side surface of the silicon wafer 2'. In this case, it is sufficient that the energy of the electron beam 7' is high enough to obtain an electron current value, namely, a value in the range of 50 V to 10 kV. The silicon wafer 2' is a silicon wafer without a silicon oxide film on the surface, that is, a bare silicon wafer, or a silicon wafer having a small ratio of oxide film covering the surface area.

Referring to the figure, ions generated from an ion source 33 are accelerated by a back stage accelerating tube electric power source 24 and formed into an ion beam to be irradiated onto the wafer 2'. In that time, although the wafer 2' is mounted on the disk 1, the wafer 2' and the disk 1 are not always in an electrically connected state but in a semi-insulated state. When the ion beam 4 is irradiated on the wafer 2' in that state, current Ii produced by the ion beam 4 flows as shown in the figure. In that time, if the current Ii flowing between the wafer 2' and the disk 1 flows in a short time, a flaw is produced on the reverse side surface of the wafer 2'.

Therefore, in the present invention, the apparatus is constructed so that a current Ie canceling the current Ii is allowed to flow between the wafer 2' and the disk 1. In other words, the reverse side surface of the wafer 2' is irradiated by the electron beam 7' extracted by a direct current electric power source 92 when a filament of the electron beam generating unit 8 is heated by an electric power source 91 of an electron beam generating unit electric power source 9. A current Ie flows as shown in the figure through the path between the wafer 2' and the disk 1 by the irradiation of the electron beam 7'. The sum of currents Ii and Ie thus flowing flows through a resistor R. The reference characters 41, 42 and 43 are current meters which indicate Ii, Ie and I, respectively. The merged current (Ii+Ie) flowing through the resistor 11 having a resistance of R is detected as a terminal voltage of the resistor 11 to input to a controller 10. The controller 10 controls the direct current electric power source so as to vary the electron extracting voltage of the electron beam generating unit 8 corresponding to the terminal voltage. As a result, the merged current (Ii+Ie) is adjusted so as to become zero.

It has been observed that frequency of occurrence of discharge flaws is decreased even when a value of the electron current is lower than a value of the ion beam current. The absolute value of the electron current in that time is smaller than that of the ion beam current.

The ion beam used in the present embodiment is an ion beam forming an insulator material by forming a compound with a silicon element such as a nitrogen ion beam or an oxygen ion beam having an energy of 40 keV to 200 keV. The ion beam current is in the range of 10 mA to 100 mA. Further, in order to increase the temperature of the silicon wafer, the silicon wafer is heated using a dedicated heating unit having a heater power supply 101 that supplies power to a lamp heater 102, as shown in FIG. 1, up to a temperature of 500° C. to 650° C. for implanting.

According to the present embodiment, it has been confirmed that the number of tiny discharge flaws on the reverse side surface of the silicon wafer 2' is decreased as the electron beam current is increased. Particularly, when the ion beam current is nearly equal to the electron current, occurrence of discharge flaws or discharge attaching objects has not been observed over a wide range of ion beam current values.

Figure 3:
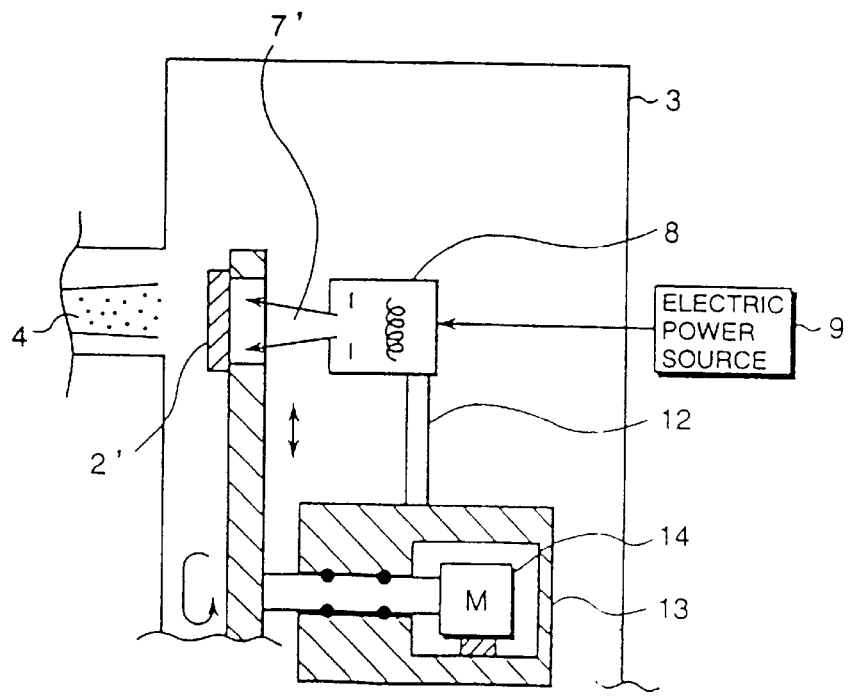
FIG. 3 is a partially cross-sectional view showing another embodiment of an ion implanting apparatus in accordance with the present invention.

FIG. 3 is a view showing another embodiment in accordance with the present invention. Although a controller 10 is also installed in this embodiment, it is not shown in the figure. In FIG. 3, the electron beam generating unit 8 is fixed onto a housing 13 surrounding a disk rotating motor 14 through a fixing member 12. The housing 13 is not rotated but moved to and fro in the radial direction of the disk, that is, up-and-down as shown by arrows in FIG. 3, in order to implant ions uniformly. Therefore, the relative positions of the electron beam generating unit 8 and the silicon wafer 2' are always maintained constant.

In the embodiment of FIG. 3, it should be noticed that the value of the electron beam current is controlled corresponding to the to-and-fro movement. In the case of the embodiment of FIG. 3, if current values of the ion and electron beams are constant over time, the ion beam current and the electron beam current flowing into the wafer itself are increased and decreased in the same rate according to the to-and-fro movement. The controller 10 performs control using a terminal voltage of the resistor 11.

Figure 4:
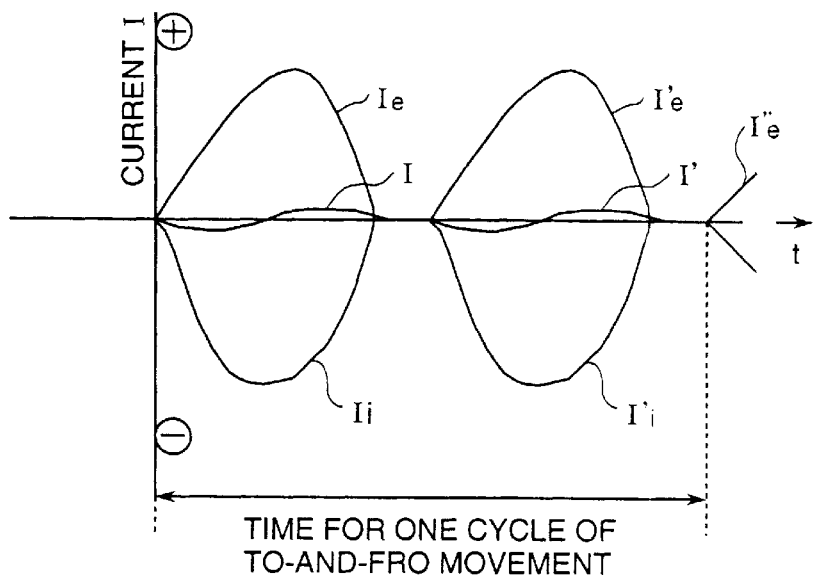
FIG. 4 is a characteristic chart showing how current changes with time for ion and electron beams entering into an embodiment of a rotating disk in accordance with the present invention.

FIG. 4 shows changes in currents Ii, Ii', Ii" by ion implanting and currents Ie, Ie' flowing into the wafer by the electron beam in the embodiment of FIG. 1. The positive and negative wave-forms indicate current wave-forms flowing into the wafer by the ion and electron beams accompanied by the positional to-and-fro movement. On the other hand, in the embodiment of FIG. 3, the ion beam current flowing into the silicon wafer is varied as Ii, Ii' in FIG. 4 accompanied by the to-and-fro movement, but the electron beam current value exceeds the ion beam current value to bring the charge out-of-balance when the electron beam current is maintained at a constant value. In this case, it has been observed that discharge flaws are produced in the reverse side surface of the wafer by the electron beam current. Therefore, in the embodiment of FIG. 3, it is inevitable that the electron beam currents Ie, Ie', Ie" are controlled based on a signal of the total current value I flowing into the disk as shown in the figure.

Figure 2A:
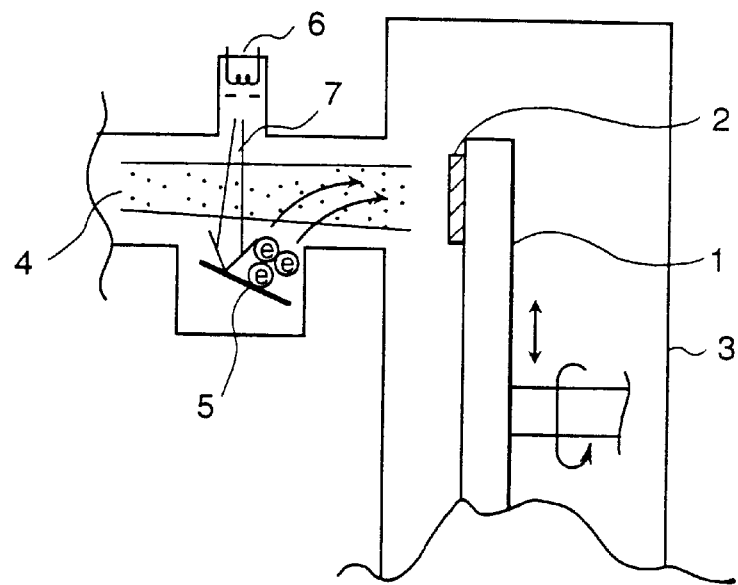
FIG. 2A and FIG. 2B show a conventional ion implanting apparatus.
Figure 2B:
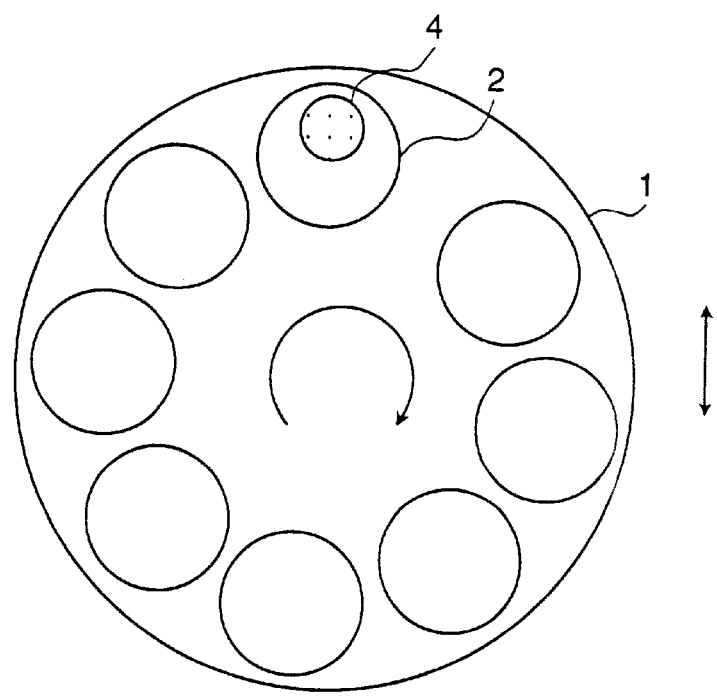
Figure 5:
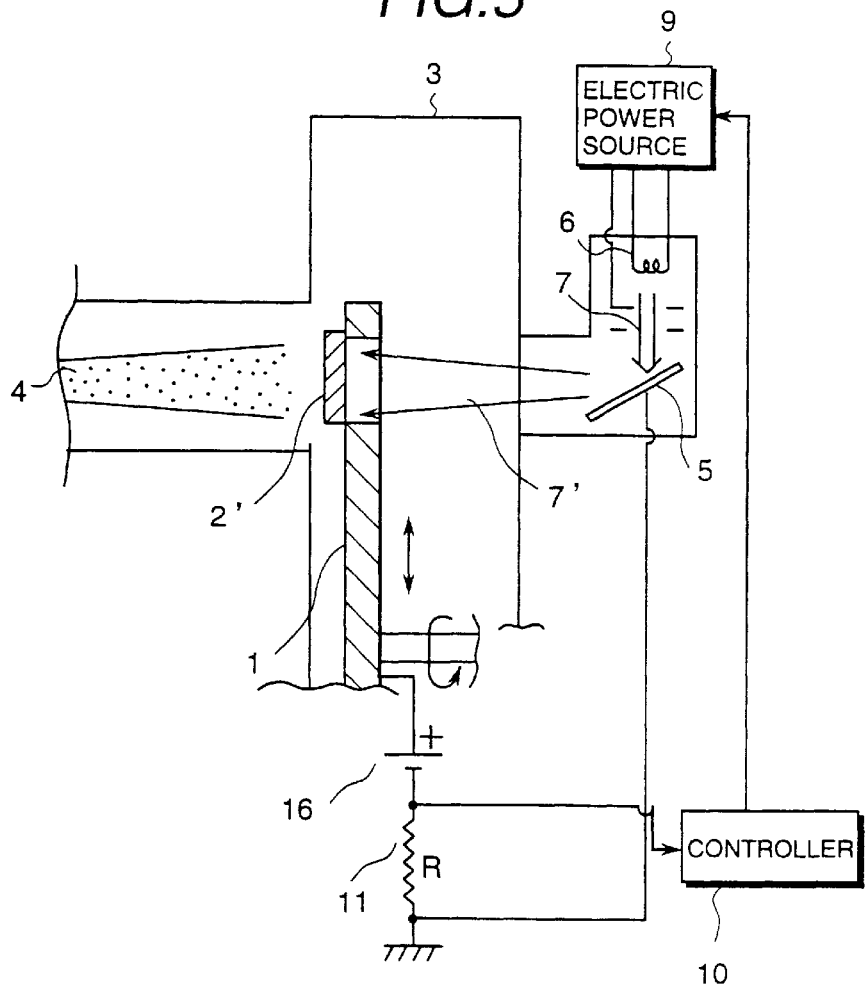
FIG. 5 is a partially cross-sectional view showing a further embodiment in accordance with the present invention.

FIG. 5 shows an embodiment where secondary electrons produced in the same manner as in the conventional method are utilized for electrons irradiated onto the reverse side surface of the silicon wafer. Since circuit elements are not formed on the reverse side surface of the silicon wafer, contamination by impurity elements due to the heated filament 6 is not so severe compared to the conventional example of FIG. 2. However, use of secondary electron is effective from the view point of realizing implantation without impurity contamination also on the reverse side surface of the wafer. In the figure, a voltage is applied between the secondary electron emitting plate 5 and the rotating disk 1 so that secondary electrons are effectively irradiated onto the silicon wafer 2'. In the conventional example of FIG. 2, voltage applied to the rotating disk 1 is 10 V in order to prevent deterioration of a resist by electron irradiation and to minimize change in the ion beam shape when secondary electrons are supplied. On the other hand, in FIG. 5, electron energy is set to 50 V using an electric power source 16 since the ion beam and the electron beam are separated and there is no surface coating of insulator.

In this embodiment, it has been observed that discharge flaws are reduced and an amount of impurity contamination accompanied by electron beam irradiation is also extremely reduced to one-tenth to one-hundredth or less compared to that in the embodiment of FIG. 1. That is, a contamination level of 10 to the 10th power per unit area has been obtained (that is, $10^{10}$ n/cm$^2$ or less) which is required for fabricating a high integrated CMOS device. Although a heating filament 6 made of tungsten is used for generating primary electrons in the embodiment of FIG. 5, the amount of contamination can be further reduced by using an electron source made of LaB$_6$ instead of the tungsten heating filament. The electron beam generating unit shown in FIG. 5 may be used for the electron beam generating unit 8 of FIG. 3.

Figure 6:
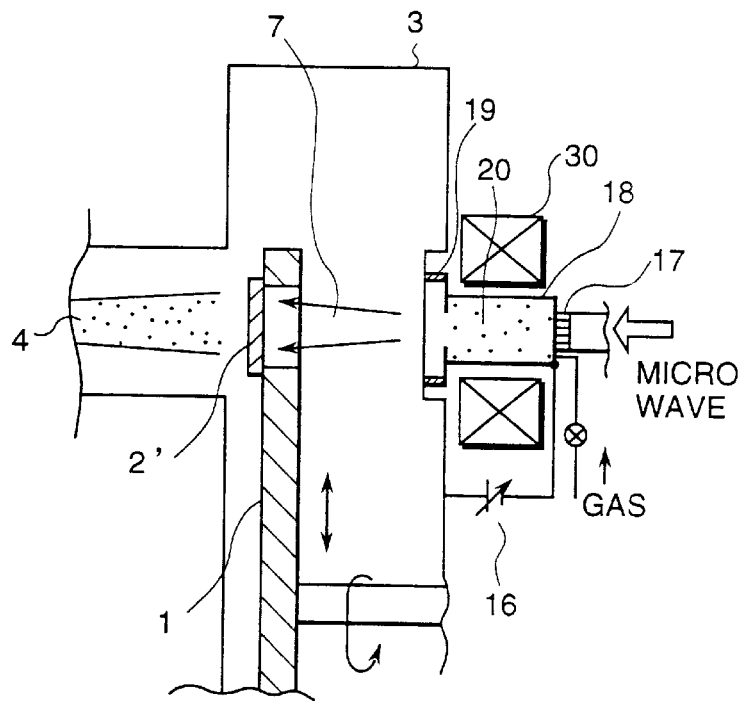
FIG. 6 is a partially cross-sectional view showing a further embodiment in accordance with the present invention.

FIG. 6 is a view explaining a further embodiment in accordance with the present invention. In this figure, an apparatus extracting an electron beam 7 from a plasma 20 is used as an electron beam generating unit instead of the heating filament. A microwave plasma formed by microwave discharging in a magnetic field generated by a coil 30 is used as a plasma source. Frequency of the microwave is 2.45 GHz. The microwave is introduced into a plasma chamber 18 through a microwave guide window 17 made of an insulator. A discharge gas is introduced into the plasma chamber 18. Oxygen gas is used as the discharge gas when an oxygen ion beam is implanted. Nitrogen gas is used as the discharge gas when a nitrogen ion beam is implanted. Further, in a case of an ion beam of a third group element or a fifth group element in the periodic law chart, such as boron, phosphorus, arsenic or the like, an inert gas such as argon, helium, neon or krypton is used. A microwave discharge plasma can discharge under a gas pressure as low as below 0.1 Pa and can be formed in a high density plasma enough to obtain a sufficient electron beam current. Further, since a clean plasma 20 not containing impurity elements can be formed, an electron beam generating unit suitable for semiconductor ion implanting can be provided.

Figure 7:
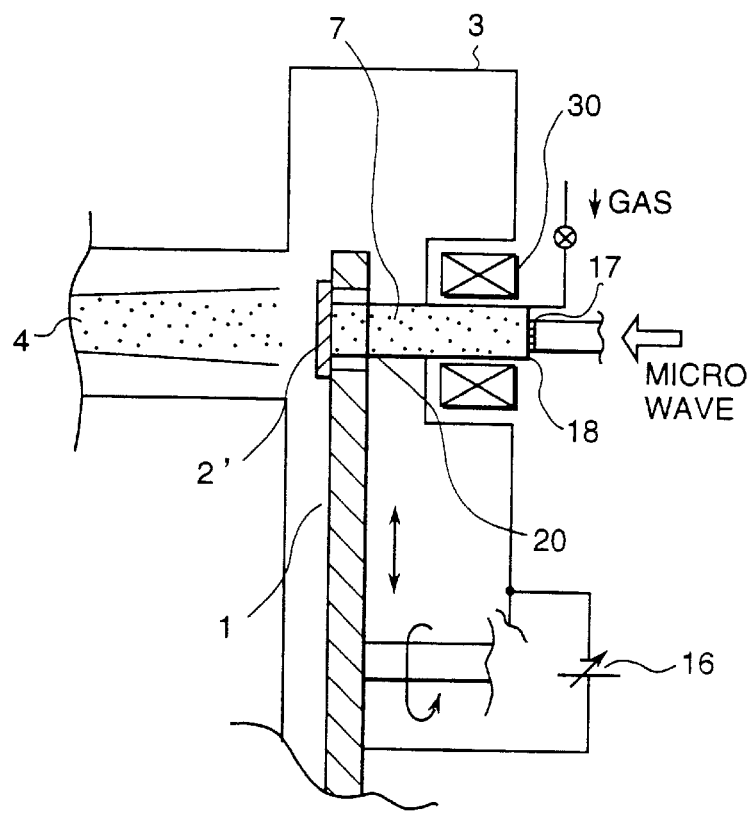
FIG. 7 is a partially cross-sectional view showing a further embodiment in accordance with the present invention.

FIG. 7 is a view showing a further embodiment in accordance with the present invention. In the figure, a microwave plasma 20 is in contact to the reverse side surface of the silicon wafer 2', and a voltage is applied between the plasma and the silicon wafer 2'. It has been observed that the number of discharge flaws is decreased only by contact of the plasma. Selection of the kind of the gas is the same as in the embodiment of FIG. 6.

The effectiveness of the present invention has been studied by an implanting test where a silicon wafer is held using an electrostatic chuck available in the present technology which is said to be capable of use at a maximum temperature of 300° C.

Figure 8:
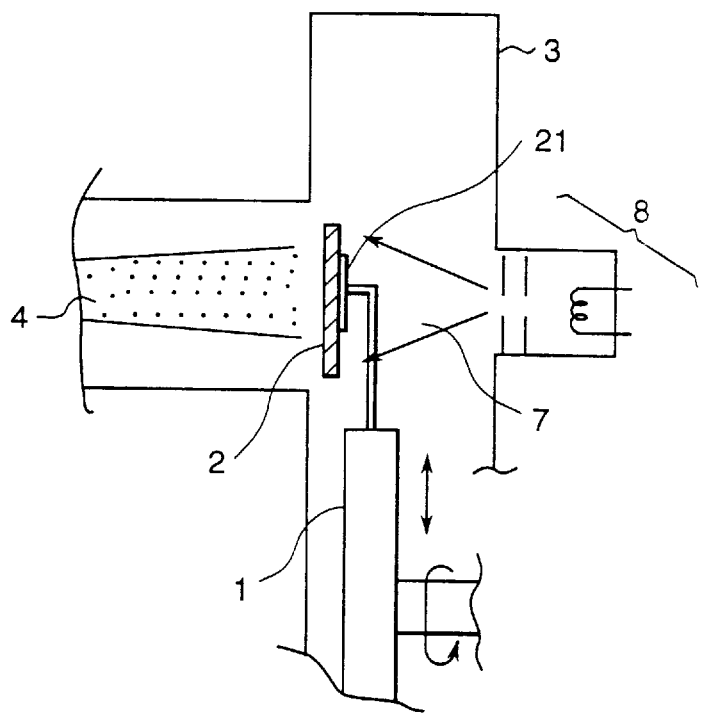
FIG. 8 is a partially cross-sectional view showing a further embodiment in accordance with the present invention.

FIG. 8 shows the embodiment. In the figure, an electrostatic chuck 21 fixes a silicon wafer 2' in contact with a part of the reverse side surface of the silicon wafer 2'. In this state, the temperature of the silicon wafer 2' is varied by adjusting a wafer heating unit, not shown. When the temperature of the silicon wafer 2' is below 300° C., discharge flaws are not produced on the reverse side surface of the silicon wafer 2' even without irradiation of electron beam or plasma since the attracting force of the electrostatic chuck 21 is strong and consequently the reverse side surface of the silicon wafer 2' is electrically contacted to the rotating disk 1 firmly. In this test, the energy of the oxygen ion is 180 keV and a current value is within the range of 30 to 100 mA.

As the temperature is increased above 300° C., the number of discharge flaws is increased in proportion to the temperature. However, by adding irradiation of the electron beam 7, the number of discharge flaws is decreased. Further, it has been observed that a required electron current value is smaller than that in the case of FIG. 1. The reason is that the gap between the silicon wafer 2' and the electrostatic chuck 21 is comparatively small since the attracting force of the electrostatic chuck 21 somewhat remains though it is substantially decreased as the temperature is raised. It is obvious that the effect of the embodiment of FIG. 8 is maintained even if the useable temperature of the electrostatic chuck 21 is raised by development of the technology in the future.

Figure 9:
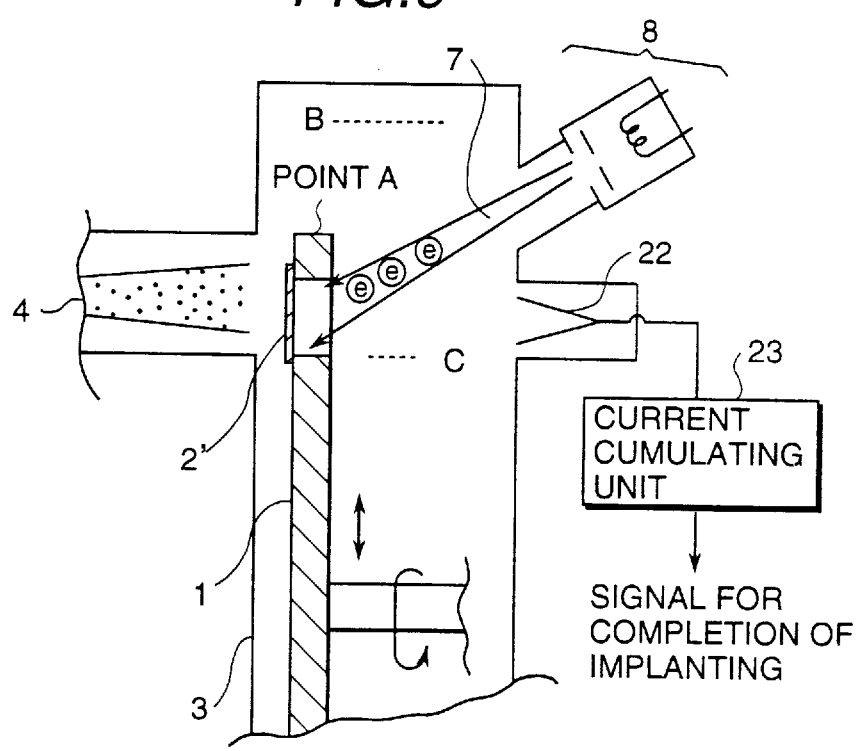
FIG. 9 is a partially cross-sectional view showing a further embodiment in accordance with the present invention.

Since the effect and the operation of the present invention have been clarified by the above-mentioned embodiment, the same technology is applied to a practically used ion implanting chamber which has a slightly different implanting chamber construction. The embodiment is shown in FIG. 9.

In the figure, an electron beam generating unit 8 is arranged in a position diagonally upward from the wafer 2'. This is because a Faraday cup 22 for measuring an ion beam is installed in the back of a rotating disk 1 in this embodiment. Referring to FIG. 9, a point A around the rotating disk 1 is moved to and fro between a position B and a position C by to-and-fro movement in the radial direction. When the point A is in the position C, the ion beam 4 enters into the Faraday cup 22.

In the practically used apparatus of this figure, a Faraday cup current is cumulated using a current cumulating unit 23. When the cumulated current reaches to a predetermined value, a signal for completion of implanting is output, as the predetermined value of implanting is obtained and the irradiation of the beam is stopped. Since the position of installing the Faraday cup 22 cannot be changed due to necessity of measuring the beam current, the electron beam generating unit is arranged in the position diagonally upside. In the present embodiment shown in the figure using an oxygen ion beam, ion implanting without discharge flaws can be attained.

Figure 10:
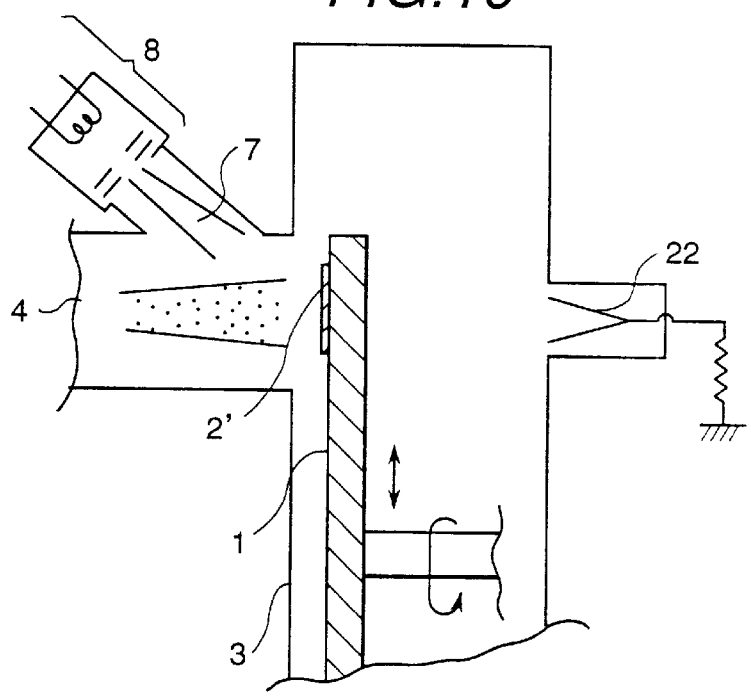
FIG. 10 is a partially cross-sectional view showing a further embodiment in accordance with the present invention.

FIG. 10 is a view showing a still further embodiment in accordance with the present invention. In this embodiment, an electron beam 7 is irradiated onto the ion beam 4 irradiating surface, that is, the front surface of a silicon wafer 2'. In this case, since the silicon wafer has no insulator film such as an oxide film on the surface, an electron beam having a higher energy above 100 V compared to the conventional example of FIG. 2 can be used and accordingly a large electron beam current can be easily obtained. In addition to this, there is no need to form an opening in a position of the rotating disk 1 corresponding to the reverse side surface of the silicon wafer. In this embodiment the effect of the electron beam irradiation has been observed. When the electron beam is not irradiated, the number of discharge flaws produced is more than 100 in a six-inch wafer. However, irradiation of the electron beam 7 reduces the number to nearly zero. In that case, the effect is confirmed under a condition of oxygen ions, beam current within the range of 10 to 100 mA and ion energy within the range of 120 to 200 keV. The test is conducted by maintaining the temperature of the wafer within the range of 500° C. to 650° C., and the electron beam is irradiated in the same level of 10 to 100 mA as the ion beam current value. Implanting is performed while the electron beam is being controlled so that the total current flowing into the rotating disk becomes zero or becomes smaller than the ion beam current using the controller 10 in the same manner as shown in FIG. 1.

In the case of this embodiment, the ion beam current value cannot be accurately measured and accordingly the amount of implantation becomes higher than a predetermined value since the electron beam also enters into the Faraday cup 22. That is, in the case of the construction shown in FIG. 10, control of implanting quantity using the Faraday cup current degrades the accuracy substantially. Therefore, the control of implanting quantity is performed as shown in the embodiment of FIG. 11.

Figure 11:
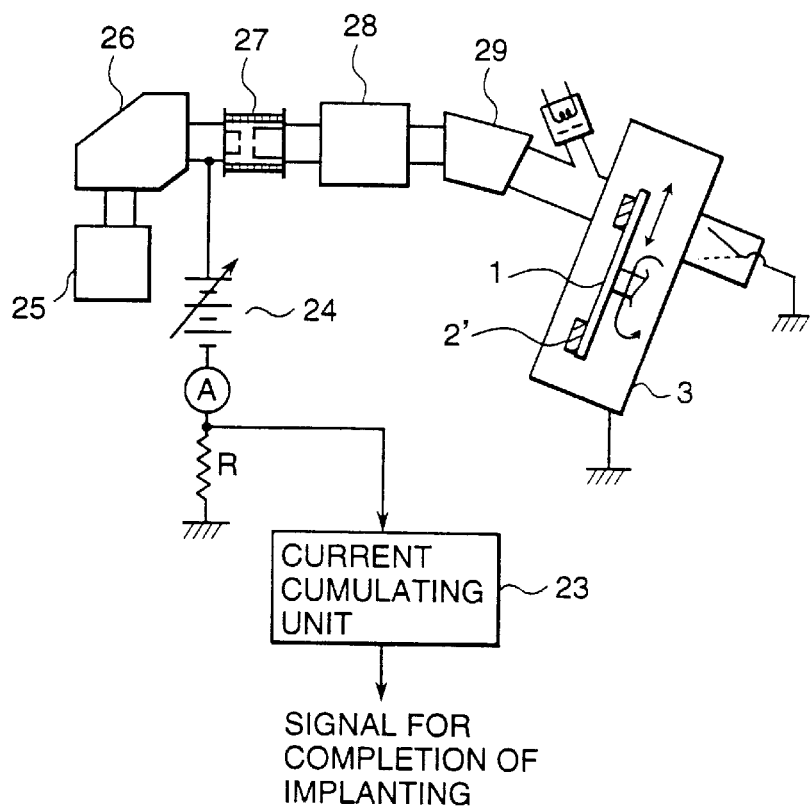
FIG. 11 is a view showing the overall construction of an ion implanting apparatus employing the embodiment of FIG. 10.

FIG. 11 shows the overall construction of an embodiment of an ion implanting apparatus in accordance with the present invention. The apparatus comprises a microwave ion source 25, a mass separator 26, a back stage accelerating tube 27, a magnetic field lens 28, a magnetic field deflector 29 and an implanting chamber 3. An ion beam extracted from the microwave ion source 25 by an extracting voltage of nearly 50 kV is selected so as to be composed of a specified kind of ions using the mass separator 26. Then, the ion beam is additionally accelerated up to a desired energy level using the back stage accelerating tube 27 to which a voltage of 200 kV at maximum is applied by a back stage accelerator tube electric power source 24. Then, the beam shape is controlled using the magnetic field lens 28 and the deflector 29 so that the beam is not eliminated by hitting on the inside wall of a transporting pipe. In the figure, the current flowing in the back stage accelerating tube electric power source 24 is the ion beam current accelerated by the accelerating tube. In the apparatus used in the embodiment, it has been found that the current value of the back stage accelerating electric power source and the current value of the Faraday cup are nearly the same and have a proportional relationship. Therefore, in the present invention, by using the current of the back stage accelerating electric power source, the apparatus is constructed in such a manner that the implanting operation is completed when a cumulated value of the current reaches a predetermined value. By the embodiment of FIG. 10 and FIG. 11, it has been also attained that the number of discharge flaws on the reverse side surface of a wafer can be decreased and an amount of ion implanting to a silicon wafer can be accurately controlled.

Although the description in this embodiment has been made of a case where an oxygen ion beam is mainly used, the same effect can be attained in the case of a boron, phosphorus or arsenic ion beam.

Using each of the above-mentioned embodiments of apparatuses, a series of tests have been conducted by implanting oxygen ions into silicon wafers of 6, 8 and 12 inch diameters with implanting quantity in the order of 10 to the 17th power ions per unit area, that is, $10^{17}$ n/cm$^2$. The ion energy is set to a value in the range of 40 keV to 200 keV, and the temperature of the wafer is set within the range of 500° C. to 650° C. Under such an implanting condition, the electron beam energy is set within the range of 50 eV to 10 keV. After implanting, the wafer 1 annealed in a nitrogen atmosphere containing a small amount of oxygen at a temperature of 1400° C. for several hours. By the heat treatment, a so-called oxide-film-embedded wafer, that is, a wafer SIMOX structure having a good quality is formed. Since there is no discharge flaw, the reverse surface has a good flatness and accordingly fabrication of a highly integrated device becomes easy. Further, since there is no contamination due to mixing or scattering of foreign objects by discharge flaws, the quality of the silicon layer formed on the embedded oxide film is improved. A CMOS device is formed on the silicon layer. A short channel effect is suppressed, latch-up is prevented and various kinds of good characteristics are obtained.

Although description has been made on the embodiment in which the ion beam is irradiated on an uppermost position of the rotating disk, the ion beam irradiation position may be placed in another position. In that case, it is clear that the present invention can be also applied by moving the disk to and fro in the radial direction on the line connecting the irradiation position and the center of the disk.

In the present embodiment described above, description has been made on a so-called batch type ion implanting where uniform implantation is performed by mounting a plurality of silicon wafers on a rotating disk. However, it is clear that the present invention can be applied not only to the batch type ion implanting but also to a case in which discharge flaws are produced on the reverse side surface of a single wafer by implanting using a large current ion beam.

Figure 12:
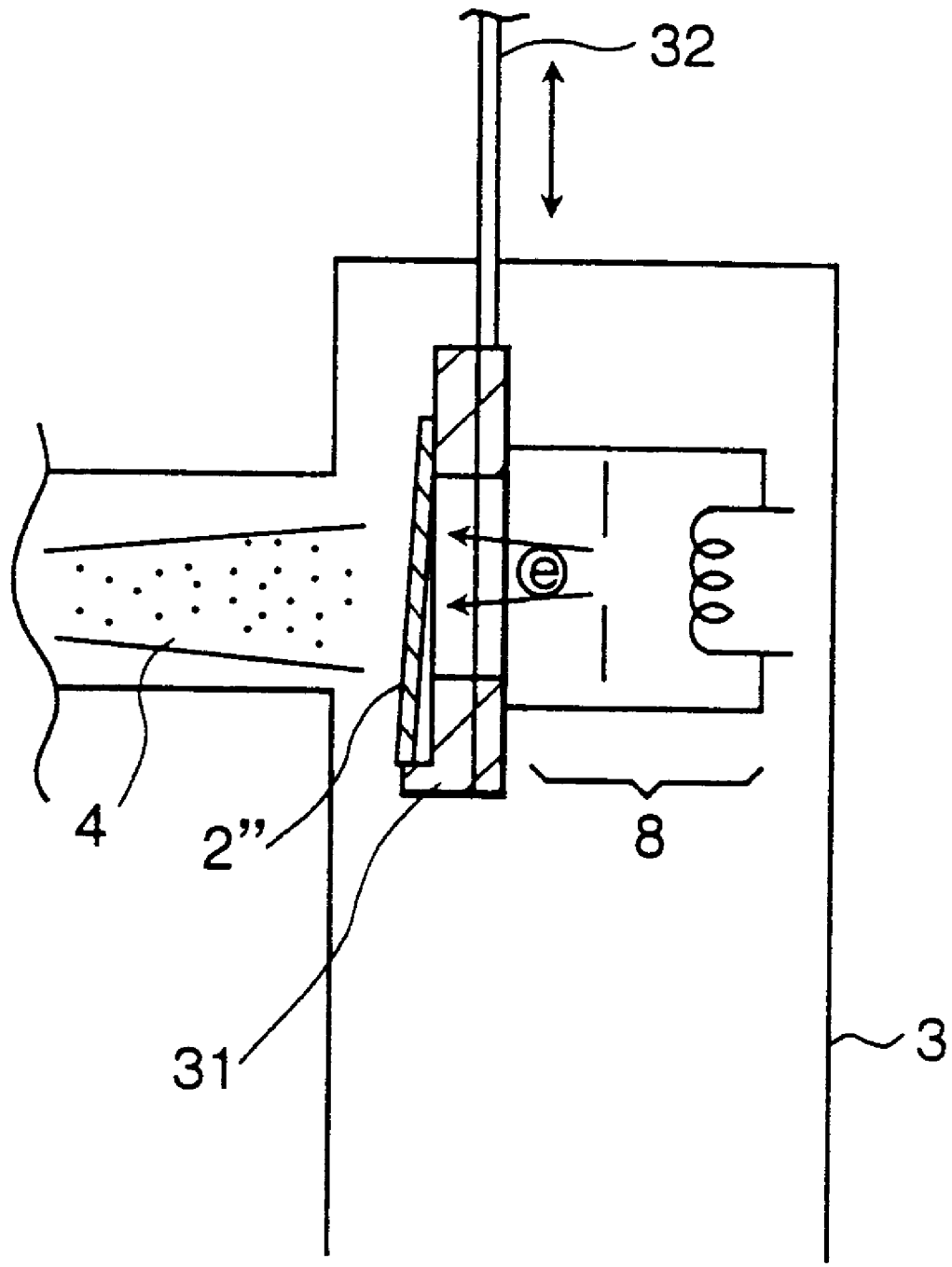
FIG. 12 is a partially cross-sectional view showing an embodiment of an ion implanting apparatus of a single-sheet type to which the present invention is applied.

FIG. 12 is a view explaining such an embodiment. The embodiment shown by the figure is a so-called single-sheet type ion implanting apparatus in which ion implanting is performed onto a silicon wafer one-by-one until an amount of implanting reaches a predetermined value.

In the embodiment shown by the figure, one silicon wafer 2" is mounted on a silicon holder 31 arranged inside an implanting chamber 3, and the silicon holder 31 is moved in the upward-and-downward direction by a wafer drive plate 32, as shown by arrows. The silicon wafer 2" mounted on the silicon holder 31 is irradiated with an ion beam 4'.

In the present embodiment, an electron beam generating unit 8 composed of a filament, an extracting electrode and so on similar to those in the above-mentioned embodiments is provided in the reverse side surface of the silicon wafer 2" to irradiate an electron beam generated by the electron beam generating unit 8 onto the reverse side surface of the silicon wafer 2" through an opening portion in the silicon holder 31 corresponding to the reverse side surface of the silicon wafer 2".

In this embodiment, an oxygen ion beam of 180 keV energy and approximately 70 mA is swept with a constant width in the direction perpendicular to the plane of the figure by a magnetic field using a beam scanner, not shown. The silicon wafer 2" is mechanically moved in the upward-and-downward direction in the figure within the swept beam to perform uniform implanting. A predetermined amount of ion implanting can be attained by controlling the number of upward-and-downward movements.

In the case where the number of upward-and-downward movements is one, the silicon wafer 2" is set on a tilt. By doing so, thermal contact is reduced so that the temperature is easily increased up to several hundreds °C. or higher by the ion beam or by a heating means, and thereby high temperature ion implanting can be performed.

In the construction of FIG. 12, without electron beam irradiation, forming of discharge flaws has been observed on the reverse side surface of silicon wafers of 6-inch diameter and 8-inch diameter. Therefore, as shown in FIG. 12, a test has been conducted by irradiating an electron beam from the reverse side surface of the silicon wafer. As a result, the number of discharge flaws is substantially reduced, and particularly when the electron beam current value is increased larger than the ion beam current value, no discharge flaw is observed. Although the test using the apparatus of FIG. 12 using wafers having diameters up to 8 inches has been described, it is obvious that the same effect can be attained when a wafer having a diameter exceeding 8 inches is used. Further, although the embodiment of FIG. 12 is a case of a combination of one-axis beam sweeping and one-axis mechanical sweeping in the direction orthogonal to the beam-sweeping direction, it is also clear that the present invention can be applied to a single sheet ion implanting which performs uniform implanting by two-axis beam sweeping or two-axis mechanical sweeping.

Although the embodiment of FIG. 12 has the electron beam generating unit for generating an electron beam composed of the filament and the extracting electrode and so on, the same effect can be attained by using an electron beam generating unit as shown in FIG. 6 in which a microwave plasma formed by microwave discharge is used and an electron beam is extracted from the plasma.

According to the present invention described above, in an ion implanting apparatus which implants ions under a high temperature into a silicon wafer having a small area ratio of its surface covered with an insulator, it is possible to perform ion implanting without forming discharge flaws on the reverse side surface of the wafer. Particularly, it is possible to provide an ion implanting apparatus of 100 mA class for practical use since no discharge flaw is formed even in ion implanting with a large current exceeding 30 mA. Further, using wafers embedding an insulator film without discharge flaws, it is possible to fabricate a large number of CMOS devices having an excellent characteristic and to provide them in practical use.

What is claimed is:

1. An ion implanting apparatus, comprising:

means for irradiating a front face of one of a plurality of silicon wafers with an ion beam while a disk mounting the silicon wafers on a surface of the disk is rotated in an evacuated chamber and reciprocates towards a radius direction of said disk; and an electron beam generator for irradiating an electron beam on a rear face of said silicon wafer irradiated by said ion beam, said electron beam generator being installed on a rear side of the disk.

2. An ion implanting apparatus as claimed in claim 1, further comprising a heating unit for heating said silicon wafers on said disk.

3. An ion implanting apparatus, comprising:

means for irradiating a front face of one of a plurality of silicon wafers with an ion beam while a disk mounting the silicon wafers on a surface of the disk is rotated in an evacuated chamber and reciprocates towards a radius direction of said disk; and a plasma source for generating a plasma by microwave discharge in a magnetic field behind said disk, so as to cause said plasma to contact a rear face of said silicon wafer irradiated by said ion beam.

4. An ion implanting apparatus as claimed in claim 3, further comprising a heating unit for heating said silicon wafers on said disk.

5. An ion implanting method, comprising the steps of:

irradiating a front face of one of a plurality of silicon wafers with an ion beam while a disk mounting the silicon wafers on a surface of the disk is rotated in an evacuated chamber and reciprocates towards a radius direction of said disk; and simultaneously irradiating an electron beam on a rear face of said silicon wafer irradiated by said ion beam.

6. An ion implanting method as claimed in claim 5, further comprising the step of heating said silicon wafers using a heating unit.

7. An ion implanting method, comprising the steps of:

irradiating a front face of one of a plurality of silicon wafers with an ion beam while a disk mounting the silicon wafers on a surface of the disk is rotated in an evacuated chamber and reciprocates towards a radius direction of said disk; and generating a plasma by microwave discharge in a magnetic field behind said disk, so as to cause said plasma to contact a rear face of said silicon wafer irradiated by said ion beam.

8. An ion implanting method as claimed in claim 7, further comprising the step of heating said silicon wafers using a heating unit.

* * * * *